United States Patent
Mori et al.

(10) Patent No.: US 10,564,185 B2
(45) Date of Patent: Feb. 18, 2020

(54) PROBER AND PROBER OPERATION METHOD

(71) Applicant: Tokyo Seimitsu Co., Ltd., Tokyo (JP)

(72) Inventors: Toshiro Mori, Tokyo (JP); Tomoya Nishida, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 16/141,596

(22) Filed: Sep. 25, 2018

(65) Prior Publication Data

US 2019/0025342 A1 Jan. 24, 2019

Related U.S. Application Data

(63) Continuation of application No. PCT/JP2017/012377, filed on Mar. 27, 2017.

(30) Foreign Application Priority Data

Mar. 28, 2016 (JP) .................................. 2016-063845
Mar. 28, 2016 (JP) .................................. 2016-063846

(51) Int. Cl.
 *G01R 1/067* (2006.01)
 *G01R 1/073* (2006.01)
 *G01R 31/28* (2006.01)

(52) U.S. Cl.
 CPC ...... *G01R 1/06794* (2013.01); *G01R 1/07342* (2013.01); *G01R 31/2831* (2013.01)

(58) Field of Classification Search
 CPC ............ G01R 1/06794; G01R 1/07342; G01R 31/2831; G01R 31/2891; G01R 31/311;
 (Continued)

(56) References Cited

U.S. PATENT DOCUMENTS 5,426,862 A   6/1995  Ham et al.
5,600,258 A * 2/1997  Graham ................. B25J 9/1694
                                                           324/756.01
(Continued)

FOREIGN PATENT DOCUMENTS

JP   H07-21919 A   1/1995
JP   2004-039752 A   2/2004
(Continued)

OTHER PUBLICATIONS

Notification of Reasons for Refusal, JP2017-059702, dated Apr. 19, 2017, 6 pgs.
(Continued)

*Primary Examiner* — Jermele M Hollington
*Assistant Examiner* — Suresh K Rajaputra
(74) *Attorney, Agent, or Firm* — Morgan, Lewis & Bockius LLP

(57) ABSTRACT

A prober for preventing a collision between a probe and a probe position detecting camera and a prober operation method are provided. A prober that performs an inspection by bringing a probe into contact with an electrode of a wafer W includes: a probe position detecting camera for detecting the position of the tip of the probe to perform relative positional alignment between the electrode of the wafer W and the probe; a probe height detector, provided separately from the probe position detecting camera, for detecting the height of the tip of the probe from a reference plane serving as a reference for the height of the probe position detecting camera; and a first height adjusting mechanism for changing the height of the probe position detecting camera from the reference plane, based on the detection result of the probe height detector.

13 Claims, 14 Drawing Sheets

(58) Field of Classification Search
CPC ............ G01R 31/2887; G01R 1/07314; G01R 31/2886
See application file for complete search history.

(56) References Cited

U.S. PATENT DOCUMENTS

| | | |
|---|---|---|
| 2007/0057683 A1 | 3/2007 | Abe |
| 2007/0229098 A1* | 10/2007 | Kobayashi ......... G01R 31/2891 324/750.23 |
| 2007/0296427 A1 | 12/2007 | Kono |
| 2009/0219046 A1 | 9/2009 | Yamada et al. |

FOREIGN PATENT DOCUMENTS

| | | | |
|---|---|---|---|
| JP | 2007-071824 | A | 3/2007 |
| JP | 2007-324340 | A | 12/2007 |
| JP | 2009-204492 | A | 9/2009 |
| JP | 2013-179329 | A | 9/2013 |

OTHER PUBLICATIONS

Notification of Reasons for Refusal, JP2017-102459, dated Jun. 9, 2017, 6 pgs.
Notification of Reasons for Refusal, JP2017-102459, dated Jul. 21, 2017, 6 pgs.
Tokyo Seimitsu Co. Ltd., International Preliminary Report on Patentability, PCT/JP2017/012377, dated Jan. 4, 2018, 11 pgs.

* cited by examiner

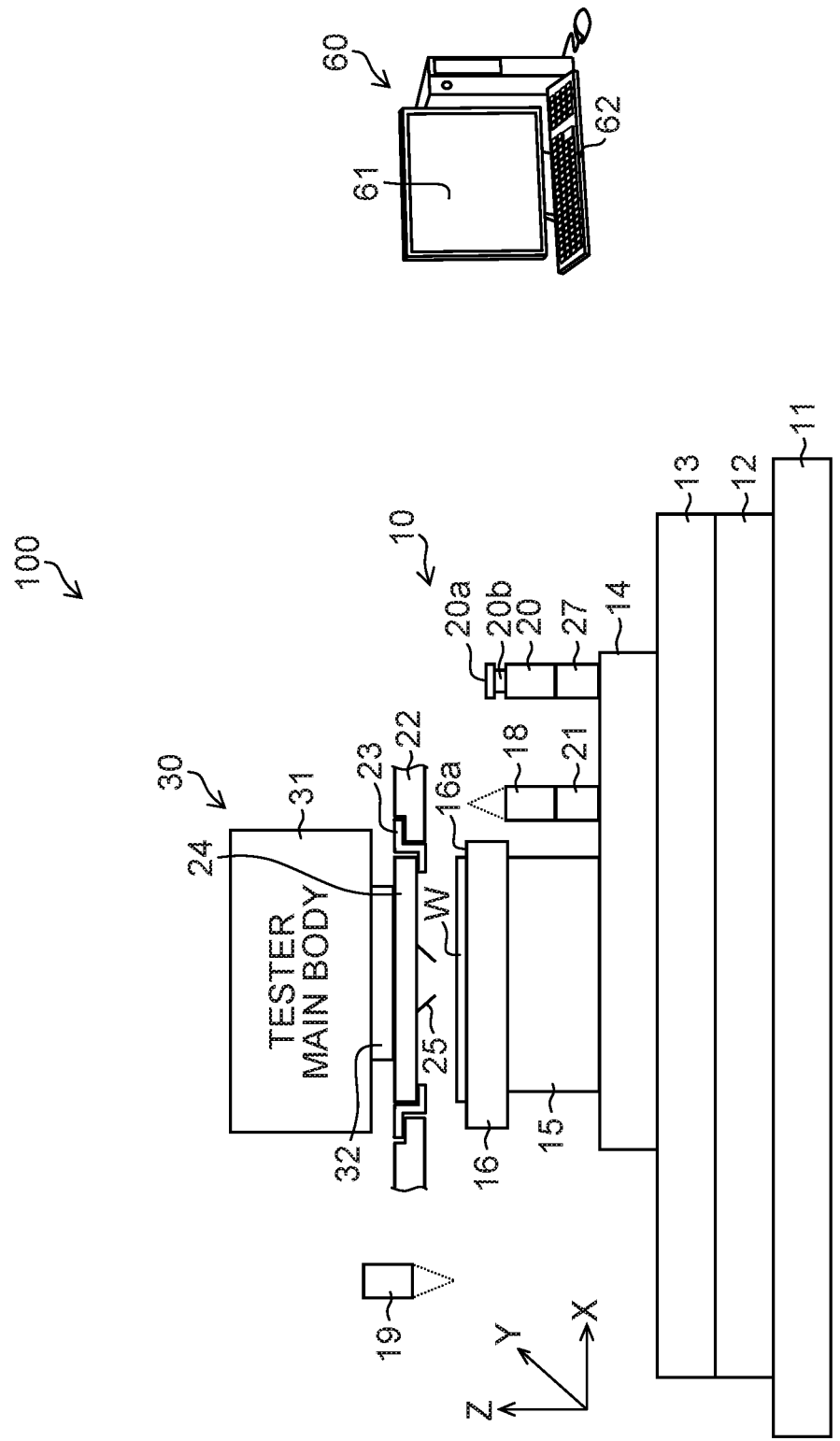

RELATED ART

PROBER AND PROBER OPERATION METHOD

CROSS-REFERENCE TO RELATED APPLICATIONS

This application is a Continuation of PCT International Application No. PCT/JP2017/012377 filed on Mar. 27, 2017, which claims priorities under 35 U.S.C. § 119(a) to Japanese Patent Application No. 2016-063845 filed on Mar. 28, 2016 and Japanese Patent Application No. 2016-063846 filed on Mar. 28, 2016. Each of the above applications is hereby expressly incorporated by reference, in their entirety, into the present application.

BACKGROUND OF THE INVENTION

1. Field of the Invention

The present invention relates to a prober that electrically inspects a plurality of chips formed on a semiconductor wafer, and an operation method of the prober.

2. Description of the Related Art

In a semiconductor fabrication process, a disk-shaped semiconductor wafer fixed to a dicing frame is cut into a plurality of chips (dies) by a dicing device in a dicing step. Prior to or after the dicing step, a wafer testing step of inspecting electrical characteristics of each chip is performed, and a prober is used in the wafer testing step.

In the wafer testing step with the prober, it is necessary to accurately bring the tips of needles (probes) of a probe card placed in the prober into contact with the wafer. Therefore, as a preliminary step of the wafer testing step with the prober, the relative positional relationship between the tips of the probes and the probe card needs to be detected with high accuracy.

As such a technique, for example, the techniques described in Japanese Patent Application Laid-Open No. 2004-39752 (hereinafter referred to as Patent Literature 1) and Japanese Patent Application Laid-Open No. 2007-71824 (hereinafter referred to as Patent Literature 2) have been proposed.

Patent Literature 1 discloses a technique of detecting a probe by taking an image of probes of a probe card with a microscope (probe position detecting camera) from below. With the technique described in Patent Literature 1, the probe position detecting camera is driven to move up and down in a Z-axis direction so as to bring the focal point of the probe position detecting camera onto the tips of the probes, and then the positions of the tips of the probes are detected.

Patent Literature 2 discloses a technique of detecting the inclination of the probe card by detecting the tips of probes at a plurality of locations with a camera (probe position detecting camera) and detecting the heights of the tips of the respective probes.

CITATION LIST

Patent Literature 1: Japanese Patent Application Laid-Open No. 2004-39752
Patent Literature 2: Japanese Patent Application Laid-Open No. 2007-71824

SUMMARY OF THE INVENTION

However, according to the technique described in Patent Literature 1, when the probe position detecting camera is moved upward along the Z-axis direction, there is a risk that the probe position detecting camera may be moved upward excessively due to an error of the operator, an error of data input, etc. and a collision between the probe and the probe position detecting camera may occur.

For example, in the case when detection of the tips of the probes is performed with the probe position detecting camera after replacing the probe card, because lengths or positions of the probes change due to the replacement of the probe card, a collision between the probe position detecting camera and the probes sometimes occurs. Note that there are various types of probe cards according to chips and measurement purposes, and changing the type of the probe card may cause a change in the probe length.

Further, for example, when an operator (or a user) inputs information, such as configuration data and product type parameters, to the prober and the probe position detecting camera is moved upward based on the information, there may be a case where the operator inputs erroneous information. When the input information is erroneous, the probe position detecting camera is moved upward along the Z-axis direction based on the erroneous information, and the probes and the probe position detecting camera may collide with each other.

Similarly, the technique described in Patent Literature 2 also has the problem that there is a risk of a collision between the probes and the probe position detecting camera. Furthermore, since the tips of the probes are detected by the probe position detecting camera, it takes time for the probe position detecting camera to focus on the tips of the probes, and there is the problem that the throughput of the prober is degraded.

The present invention has been made in view of the above circumstances, and an object of the invention is to provide a prober and a prober operation method that prevent a collision between the probes and the probe position detecting camera.

In order to achieve the above object, a prober according to one aspect of the present invention is a prober that performs an inspection by bringing a probe into contact with an electrode of a wafer, and includes: a probe position detecting camera configured to detect a position of a tip of the probe to perform relative positional alignment between the electrode of the wafer and the probe; a probe height detector provided separately from the probe position detecting camera and configured to detect a height of the tip of the probe from a reference plane serving as a reference for the height of the probe position detecting camera; and a first height adjusting mechanism configured to change the height of the probe position detecting camera from the reference plane based on a detection result of the probe height detector.

According to the present aspect, the height of the tip of the probe is detected by the probe height detector provided separately from the probe position detecting camera, and the height of the probe position detecting camera is changed based on the detected height of the tip of the probe by the first height adjusting mechanism. Therefore, in the present aspect, even when a probe card is replaced or the input information (configuration data, product type parameters) is erroneous, since the height of the tip of the probe is measured by the probe height detector, the height of the tip of the probe can be accurately detected and it is possible to prevent a collision between the probe position detecting camera and the probe.

Preferably, the probe height detector is a contact-type detector including a contact surface that comes into contact with the tip of the probe and configured to detect the height of the contact surface when the tip of the probe makes contact with the contact surface as the height of the tip of the probe.

According to the present aspect, since the probe height detector includes the contact surface and detects the height of the tip of the probe by bringing the contact surface into contact with the tip of the probe, it is possible to accurately and quickly detect the height of the tip of the probe.

The probe height detector preferably includes a linear variable differential transformer that detects contact of the tip of the probe with the contact surface.

According to the present aspect, it is possible to improve accuracy in detecting the contact of the tip of the probe with the contact surface. As a result, it is possible to improve accuracy in measuring the height of the tip of the probe from the reference plane. Moreover, it is possible to accurately detect the movement amount (pushed amount) of the contact surface caused by the contact of the tip of the probe with the contact surface, and a pressing force caused by the contact.

Preferably, the probe height detector is provided integrally with the probe position detecting camera, and the height of the contact surface of the probe height detector is set at a position higher than the height of an end portion of an objective lens of the probe position detecting camera.

According to the present aspect, since the probe height detector is provided integrally with the probe position detecting camera, the height of the probe height detector is changed by the height adjusting mechanism of the probe position detecting camera. Hence, in the present aspect, since there is no need to separately provide a height adjusting mechanism of the probe height detector, it is possible to reduce the number of height adjusting mechanisms, thereby realizing simplification of control of the height adjusting mechanism and simplification of manufacturing of the prober.

Further, according to the present aspect, the height of the contact surface of the probe height detector is set at a position higher than the height of the probe position detecting camera. Therefore, since the tip of the probe comes into contact with the probe height detector before the tip of the probe collides with the probe position detecting camera, it is possible to prevent occurrence of a collision between the probe position detecting camera and the tip of the probe.

Preferably, the contact surface of the probe height detector is set at a position lower than a height calculated by adding a working distance of the probe position detecting camera to the height of the probe position detecting camera.

According to the present aspect, the height of the contact surface of the probe height detector is set at a position lower than the height calculated by adding the working distance of the probe position detecting camera to the height of the probe position detecting camera. Thus, in the present aspect, it is possible to prevent the probe height detector from coming into contact with the tip of the probe and interfering with a detection operation by the probe position detecting camera when the probe position detecting camera is detecting the tip of the probe.

Preferably, the probe height detector is provided independently of the probe position detecting camera, and the prober further includes a second height adjusting mechanism configured to change the height of the probe height detector from the reference plane.

According to the present aspect, the probe height detector is provided independently of the probe position detecting camera, and the height adjusting mechanism for changing the height of the probe height detector is further provided.

Therefore, in the present aspect, since the probe height detector and the probe position detecting camera independently adjust the heights, it is possible to more efficiently detect the height of the tip of the probe.

Preferably, the probe height detector is of a contact type, and the prober further includes a control unit configured to detect an inclination of a probe card placed in the prober based on results of detection performed a plurality of times by the probe height detector. Note that the probe height detector includes a contact surface that comes into contact with the tip of the probe, and detects the height of the contact surface when the tip of the probe makes contact with the contact surface as the height of the tip of the probe, and it is preferable that the probe height detector detects the height of the tip of the probe from a reference plane serving as a reference for the height of the tip of the probe a plurality of times.

Preferably, the probe height detector includes: a contact surface that comes into contact with the tip of the probe; and a linear variable differential transformer for detecting the contact of the tip of the probe with the contact surface, and the probe height detector detects the height of the contact surface when the tip of the probe makes contact with the contact surface as the height of the tip of the probe.

A prober operation method according to another aspect of the present invention is a prober operation method that performs an inspection by bringing a probe into contact with an electrode of a wafer, and includes: a first height detection step of detecting a height of a tip of the probe from a reference plane serving as a reference for a height of a probe position detecting camera by using a probe height detector provided separately from the probe position detecting camera; a step of changing the height of the probe position detecting camera from the reference plane based on a detection result of the probe height detector; and a step of detecting a position of the tip of the probe by using the probe position detecting camera to perform relative positional alignment between the electrode of the wafer and the probe.

Preferably, the first height detection step detects the height of the tip of the probe by using the probe height detector including the contact surface that comes into contact with the tip of the probe and a linear variable differential transformer for detecting the contact of the tip of the probe with the contact surface.

Preferably, the probe height detector is of a contact type, the first height detection step detects the height of the tip of the probe a plurality of times by using the contact-type probe height detector, and the prober operation method further includes an inclination detection step of detecting an inclination of a probe card based on detection results in the first height detection step. Note that, in the first height detection step, it is preferable to detect the height of the tip of the probe from a reference plane serving as a reference for the height of the tip of the probe a plurality of times by using the contact-type probe height detector including a contact surface that comes into contact with the tip of the probe and detecting the height of the contact surface when the tip of the probe makes contact with the contact surface as the height of the tip of the probe.

According to the present aspect, since the tip of the probe of the probe card is detected by the probe height detector, the time taken for focusing onto the tip of the probe is not required, and it is possible to prevent a degradation in the throughput of the prober.

Preferably, the prober operation method further includes a second height detection step of detecting the height of the tip of the probe from the reference plane a plurality of times by using the probe position detecting camera provided integrally with the probe height detector, and the inclination detection step detects the inclination of the probe card based on the detection results in the first height detection step and detection results in the second height detection step.

According to the present aspect, since the height of the tip of the probe is detected using the probe position detecting camera provided integrally with the probe height detector, the heights of the probe height detector and the probe position detecting camera are adjusted by the same height adjusting mechanism, and consequently control of height adjustment is further simplified.

Moreover, according to the present aspect, since the inclination detection step detects the inclination of the probe card based on the detection results in the first height detection step and the second height detection step, the inclination of the probe card can be detected with higher accuracy.

The first height detection step is preferably performed before the second height detection step.

Preferably, in the first height detection step, the height of the contact surface when the tip of the probe makes contact with the contact surface is detected as the height of the tip of the probe by using the probe height detector including the contact surface that comes into contact with the tip of the probe and a linear variable differential transformer for detecting the contact of the tip of the probe with the contact surface.

According to the present aspect, it is possible to improve accuracy in detecting the contact of the tip of the probe with the contact surface. As a result, it is possible to improve accuracy in measuring the height of the tip of the probe from the reference plane. In addition, it is possible to accurately detect the movement amount (pushed amount) of the contact surface caused by the contact of the tip of the probe with the contact surface, and a pressing force caused by the contact.

According to the present aspect, after the step of detecting the height of the tip of the probe by the probe height detector that detects the height of the tip of the probe by physical contact, the height of the tip of the probe is detected using the probe position detecting camera, and therefore it is possible to detect the inclination of the probe card while preventing the probe position detecting camera from colliding with the probe.

According to the present invention, the probe position detecting camera and the probe height detector provided separately from the probe position detecting camera are mounted, and the first height adjusting mechanism changes the height of the probe position detecting camera, based on the height of the tip of the probe detected by the probe height detector, and therefore occurrence of a collision between the probe position detecting camera and the probe can be prevented.

BRIEF DESCRIPTION OF THE DRAWINGS

FIG. 1 is a schematic configuration diagram illustrating a wafer test system according to a first embodiment.

DESCRIPTION OF EMBODIMENTS

Figure 2A:
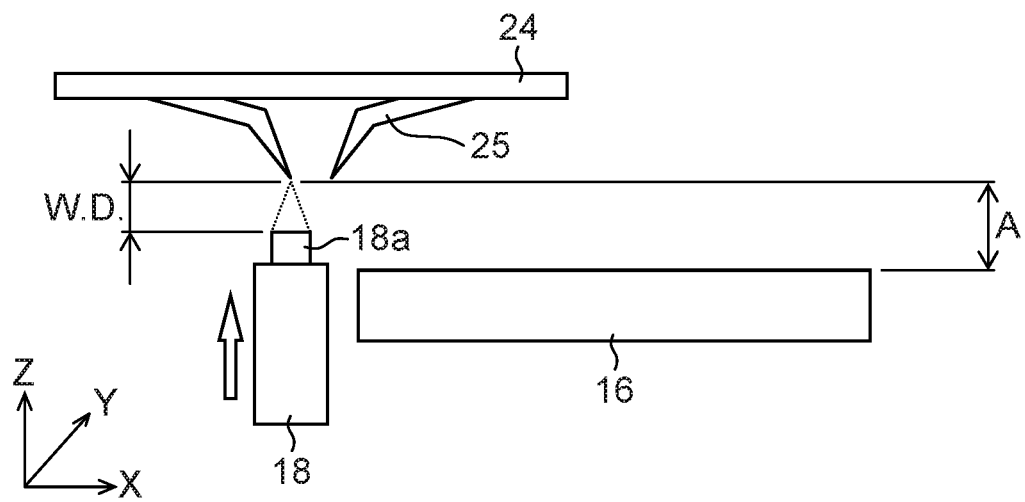
FIG. 2A is a conceptual diagram illustrating a case when a height of a tip of a probe is properly detected only by a probe position detecting camera.

The following will describe preferred embodiments of the present invention with reference to the accompanying drawings.

First Embodiment

FIG. 1 is a schematic configuration diagram illustrating a first embodiment of a wafer test system to which the present invention is applied. As shown in the drawing, a wafer test system 100 includes a prober 10 that brings each probe 25 into contact with an electrode of each chip on a wafer W, and a tester 30 that is electrically connected to the probes 25, applies an electric current and a voltage to each chip for electrical inspection, and measures characteristics.

The prober 10 includes: a base 11; a moving base 12 attached to the base 11; a Y-axis moving table 13; an X-axis moving table 14; a Z-axis moving and rotating part 15; a wafer chuck 16; a probe position detecting camera 18; a probe height detector 20; height adjusting mechanisms 21, 27; a wafer alignment camera 19; a head stage 22; a card holder 23 mounted on the head stage 22; a probe card 24 attached to the card holder 23; and a control unit 60 (computer) that controls respective parts of the prober 10 and the tester 30. The probe card 24 is provided with probes 25.

The moving base 12, the Y-axis moving table 13, the X-axis moving table 14 and the Z-axis moving and rotating part 15 constitute a moving and rotating mechanism that rotates the wafer chuck 16 in three axial directions and around a Z axis. Since the moving and rotating mechanism has been widely known, an explanation will be omitted here.

The wafer chuck 16 holds, by vacuum suction, the wafer W on which a plurality of chips are formed, and a heating-cooling mechanism (heating and cooling mechanism) as a heating-cooling source is installed inside the wafer chuck 16 so that electric characteristics of the chips are inspected in a high temperature condition, for example, at a maximum of 150° C., or a low temperature condition, for example, at a minimum of −40° C. As the heating-cooling mechanism, a well-known heater-cooler can be suitably adopted, and various heater-coolers are considered, such as, for example, a heating-cooling mechanism with a double layer structure including a heating layer of a surface heater and a cooling layer provided with a cooling fluid passage, and a heating-cooling device with a single layer structure in which a cooling pipe around which a heater is wound is buried in a thermal conductor. It is also possible to circulate a thermal fluid, or use a Peltier element, instead of electrical heating.

The wafer chuck 16 is mounted on the Z-axis moving and rotating part 15 and can be moved in three axial directions (X, Y, Z-axis directions) and can be rotated in a rotating direction (θ direction) around the Z axis by the above-described moving and rotating mechanism.

The probe card 24 is arranged above the wafer chuck 16 on which the wafer W is held. Attached to the probe card 24 is the card holder 23 mounted in an opening portion of the head stage 22 constituting a top plate of a housing of the prober 10.

The probe card 24 has the probes 25 which are arranged corresponding to the arrangement of the electrodes of the chips to be inspected. The probe card 24 is replaced according to the chips to be inspected. Note that the probe card 24 is an example of a probe holding part.

The tester 30 includes a tester main body 31, and a contact ring 32 attached to the tester main body 31. The probe card 24 has terminals to be connected to the respective probes 25, and the contact ring 32 has spring probes arranged to come into contact with the terminals. The tester main body 31 is held to face the prober 10 by a support mechanism (not shown).

The probe position detecting camera 18 detects the position of the tip of the probe 25 to perform relative positional alignment between the electrode of the wafer W and the probe 25. The probe position detecting camera 18 is mounted on the X-axis moving table 14 and is movable in the X and Y directions integrally with the wafer chuck 16 by the X-axis moving table 14 and the Y-axis moving table 13. Driving (lifting drive) for moving the probe position detecting camera 18 up and down in the Z-axis direction is performed by the height adjusting mechanism 21 controlled by the control unit 60. The probe position detecting camera 18 detects the position of the tip of the probe 25 by taking an image of the probe 25 of the probe card 24 from below. The position (X and Y coordinates) of the tip of the probe 25 in a horizontal plane is detected by the coordinates of the camera, and the position in a vertical direction (the Z-axis direction), that is, the height of the tip of the probe 25 (probing height) is detected by the focal point position of the camera. The results of detection by the probe position detecting camera 18 are input to the control unit 60. For the probe position detecting camera 18, for example, a camera having an alignment microscope including an objective lens 18a is used (see FIG. 2).

The wafer alignment camera 19 is disposed in an alignment region adjacent to a probe region where the probe card 24 is placed. The wafer alignment camera 19 is supported by a support column, not shown, and is movable in the Z-axis direction (vertical direction) by a camera lifting mechanism (not shown). The camera lifting mechanism may be any known linear moving mechanism and includes, for example, a linear guide mechanism and a ball screw mechanism, etc., and is driven by an output from the control unit 60. The wafer alignment camera 19 detects the position of the electrode of a chip formed on the surface of the wafer W (chip surface electrode) by taking an image of the wafer W held on the wafer chuck 16 from above. The detection result obtained by the wafer alignment camera 19 is input to the control unit 60. Based on the information obtained by the wafer alignment camera 19 and the positional information about the tip of the probe 25 obtained by the probe position detecting camera 18, the control unit 60 automatically performs two-dimensional position alignment between the probe 25 and the electrode of the chip of the wafer W (chip surface electrode) in the XY plane, using a known image processing technique to.

The probe height detector 20 is provided separately from the probe position detecting camera 18 and detects the height of the tip of the probe 25 from a reference plane serving as a reference for the height of the probe position detecting camera 18. The probe height detector 20 is a so-called contact-type detector and detects the height of the tip of the probe 25 by making physical contact with the tip of the probe 25. The probe height detector 20 is not particularly limited as long as the probe height detector 20 can detect the height of the tip of the probe 25 by making physical contact with the tip of the probe 25, and a known technique is applied. Here, the reference plane is a plane serving as a reference for the height of the entire prober 10 and is set arbitrarily. For example, the reference plane is set at the upper surface of the X-axis moving table 14. Note that the probe height detector 20 is not limited to a detector for detecting the tip of the probe 25 by physical contact, and it is also possible to adopt a known technique of detecting the tip of the probe 25. For example, the probe height detector 20 may detect the tip of the probe 25 by a non-contact type method.

The probe height detector 20 includes a contact surface 20a and a sensor mechanism 20b (see FIG. 3). The contact surface 20a comes into contact with the tip of the probe 25 and outputs a signal to the sensor mechanism 20b at the time of the contact. Then, the sensor mechanism 20b receives the signal output from the contact surface 20a and a signal about the height output from the height adjusting mechanism 27, and outputs information about the height of the tip of the probe to the control unit 60. In short, the sensor mechanism 20b brings the tip of the probe 25 into contact with the contact surface 20a, and outputs the height of the contact surface 20a at the time when the tip of the probe 25 makes contact with the contact surface 20a as the height of the tip of the probe 25 to the control unit 60.

The height adjusting mechanism 21 (first height adjusting mechanism) of the probe position detecting camera 18 perform driving for moving the probe position detecting camera 18 up and down along the Z-axis direction under the control of the control unit 60. The height adjusting mechanism 21 is controlled by the control unit 60 (FIG. 4) for the prober 10. The lifting drive is controlled by the user or a program installed in the control unit 60. For example, the height adjusting mechanism 21 changes the height of the probe position detecting camera 18 from the reference plane, based on the detection result of the probe height detector 20. In short, the height adjusting mechanism 21 adjusts the probe position detecting camera 18 to a height separated from the tip of the probe 25 by a working distance, based on the height of the tip of the probe 25 measured by the probe height detector 20. Thus, since the height of the probe position detecting camera is adjusted using the height of the tip of the probe detected once by the probe height detector 20, it is possible to prevent the probe position detecting camera 18 from being moved upward excessively, and thereby preventing the probe position detecting camera 18 from colliding with the tip of the probe 25 when the probe position detecting camera 18 is driven to move up and down along the Z-axis direction.

The height adjusting mechanism 27 (second height adjusting mechanism) of the probe height detector 20 drives to move the probe height detector 20 up and down along the Z axis. The height adjusting mechanism 27 is provided independently of the above-described height adjusting mechanism 21, and is controlled by the control unit 60 in the same manner as the height adjusting mechanism 21 to perform driving for moving the probe height detector 20 up and down.

The control unit 60 is capable of controlling the entire wafer test system 100 (the prober 10 and the tester 30) and is constituted by a computer. The control unit 60 is connected to the respective parts of the wafer test system 100 (omitted in the drawings) and can receive signals from the respective parts of the wafer test system 100 and can send signals to the respective parts. The computer constituting the control unit 60 has an input unit 62 and a display unit 61, and the user inputs information through the input unit 62 and the control unit 60 notifies the user of an error by displaying information on the display unit 61.

Figure 2B:
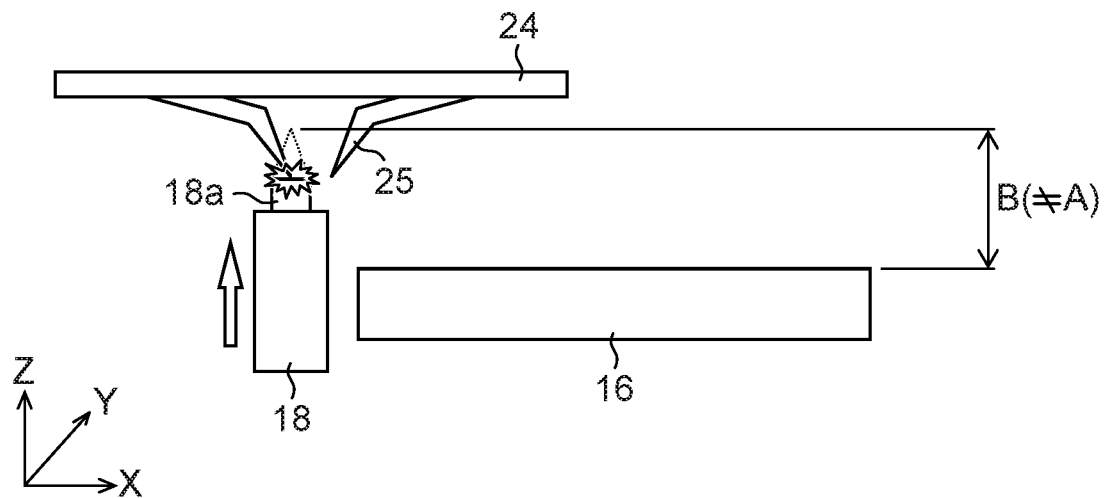
FIG. 2B is a conceptual diagram illustrating a case when a tip of a probe collides with the probe position detecting camera.

FIG. 2A and FIG. 2B are conceptual diagrams illustrating a case when the height of the tip of the probe 25 is detected only by the probe position detecting camera 18.

FIG. 2A is a conceptual diagram when the probe position detecting camera 18 detects the tip of the probe 25 normally. In the case when the probe position detecting camera 18 detects the height of the tip of the probe 25, first, the user inputs configuration data and product type parameters, etc. to the control unit 60 through the input unit 62, and a distance A between the wafer chuck 16 and the tip of the probe 25 is calculated based on the input values in the control unit 60. Then, based on the calculated distance A, the probe position detecting camera 18 is rapidly moved upward to a height (working distance height) at which the probe position detecting camera 18 and the tip of the probe 25 are apart from each other by the working distance (indicated as WD in the drawing) by the height adjusting mechanism 21. Note that, in this case, the height of the wafer chuck 16 is known.

Here, the configuration data is data such as the setting parameters of various functions of the prober 10 and the coordinate values of the mount positions of the installed devices such as the microscope, and is stored in an HDD (hard disk drive) of the control unit 60 as unique data for each prober 10.

For example, the configuration data includes a height measurement from the reference coordinates of the prober to the probe card mount surface.

The product type parameters are recorded data about specifications of a product, such as the product wafer W and a size and arrangement of the chips on the product wafer W. The product type parameters are data arbitrarily created by the user and normally stored in the HDD of the control unit 60.

Since the probe card 24 is manufactured exclusively according to the specifications of the product wafer W, individual information on the probe card 24 is also included. For example, the product type parameters also include a height measurement from a substrate surface of the probe card 24 to the tip of the probe 25.

The probe position detecting camera 18 moved upward to the working distance height automatically focuses on the probe, and detects the tip of the probe 25 and detects the height of the tip of the probe 25. Here, as a method of lifting the probe position detecting camera 18, it is conceivable to adopt a method in which the probe position detecting camera 18 is moved upward little by little while performing automatic focusing (auto-focusing) by the probe position detecting camera 18 to continuously detect the probe 25. However, such a method of moving the probe position detecting camera 18 upward little by little is not preferable from the viewpoint of throughput because a long operation time is required.

FIG. 2B is a diagram illustrating an example of a case when a collision between the probe position detecting camera 18 and the tip of the probe 25 occurs.

If there is an error in inputting the configuration data and the product type parameters, etc., the control unit 60 cannot accurately calculate the distance A as described with FIG. 2A. In the case of FIG. 2B, the distance between the tip of the probe 25 and the wafer chuck 16 should have been calculated as the distance A in a similar manner to FIG. 2A, but the control unit 60 calculates the distance erroneously as a distance B (distance B>distance A). The control unit 60 controls the height adjusting mechanism 21 based on the erroneously calculated distance B and moves the probe position detecting camera 18 upward to the working distance height instantly, and consequently the probe position detecting camera 18 collides with the tip of the probe 25. The collision between the probe position detecting camera 18 and the probe 25 causes problems, such as breakage of the probe 25 and the probe card 24, and breakage of the probe position detecting camera 18.

According to one aspect of the present invention, it is possible to prevent the collision between the probe position detecting camera 18 and the tip of the probe 25 as described with FIG. 2A and FIG. 2B.

Next, referring to FIGS. 3A, 3B and 4, the detection of the height of the tip of the probe 25 with the use of the probe height detector 20 in the present invention will be described.

Figure 3A:
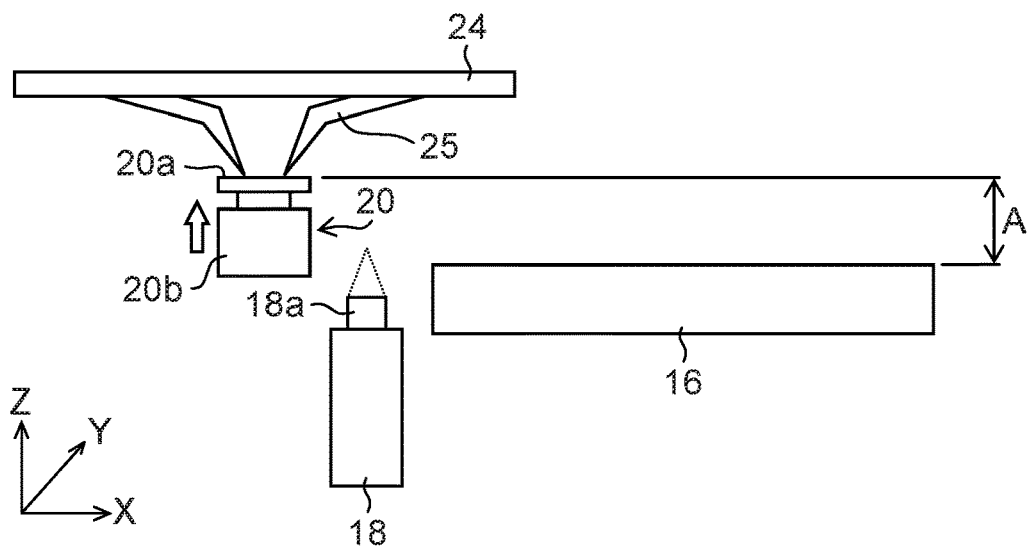
FIG. 3A is an explanatory view regarding detection of the height of the tip of the probe performed by a probe height detector.
Figure 3B:
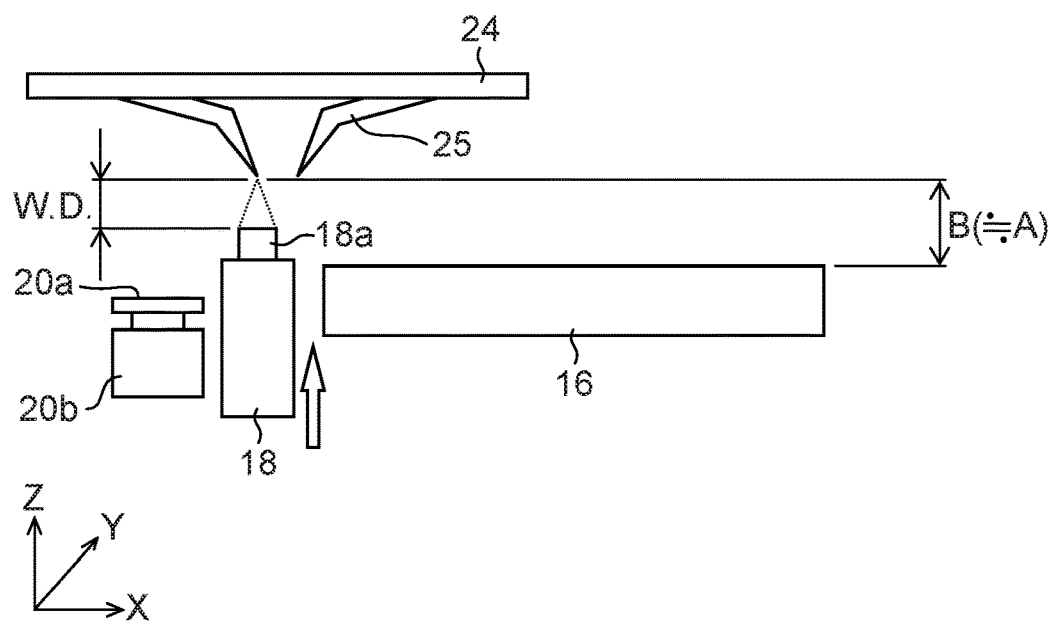
FIG. 3B is an explanatory view regarding detection of the height of the tip of the probe performed by a probe height detector.

FIG. 3A and FIG. 3B are explanatory diagrams regarding detection of the tip of the probe 25 performed by the probe height detector 20.

FIG. 3A is a diagram for explaining detection of the height of the probe 25 by the probe height detector 20. When the probe position detecting camera 18 focuses on the tip of the probe 25 or is moved upward to the working distance height, first, the position of the probe 25 is detected by the probe height detector 20. More specifically, the probe height detector 20 is moved upward by the height adjusting mechanism 27 until the probe height detector 20 comes into contact with the tip of the probe 25. When the probe height detector 20 comes into contact with the probe 25 at the contact surface 20a, the probe height detector 20 outputs a signal to the sensor mechanism 20b. Based on the signal output from the contact surface 20a and a signal indicating the height which is output from the height adjusting mechanism 27, the sensor mechanism 20b outputs information about the height of the tip of the probe 25 to the control unit 60 (see FIG. 4).

Figure 4:
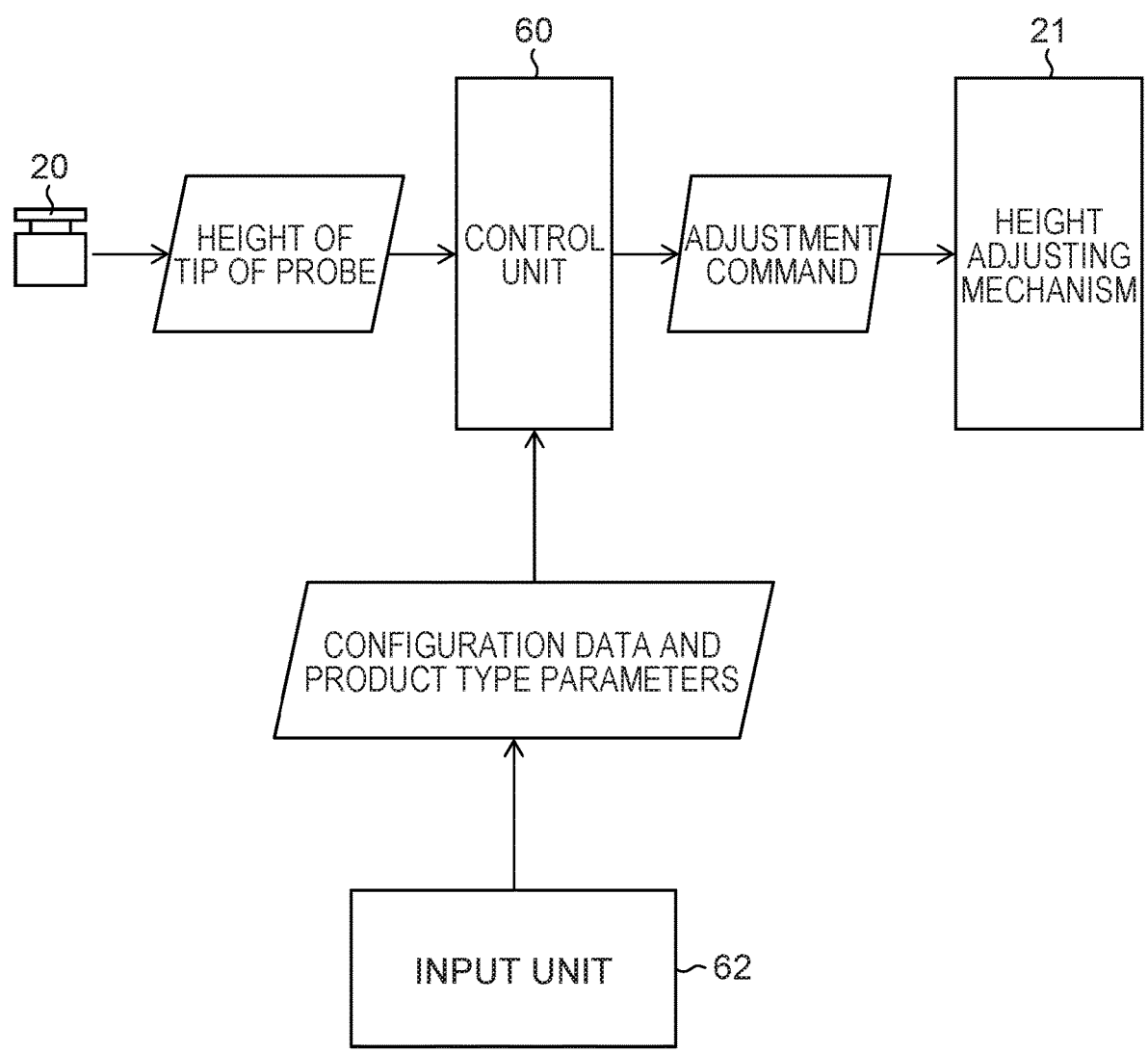
FIG. 4 is a diagram conceptually illustrating information input to a control unit and information output from the control unit, together with function blocks.

FIG. 4 is a diagram conceptually illustrating the information input to the control unit 60 and the information output from the control unit 60 with function blocks.

As shown in FIG. 4, the information about the height of the tip of the probe 25, that is, an actual measurement value of the probe height detector 20 is input to the control unit 60. In addition, the configuration data and the product type parameters input by the user through the input unit 62 are input to the control unit 60, and the control unit 60 calculates the distance between the wafer chuck 16 and the tip of the probe 25 from the input configuration data and product type parameters.

Thereafter, the control unit 60 compares the height of the probe 25 detected by the probe height detector 20 with the height of the probe 25 calculated from the configuration data and the product type parameters. Then, based on the comparison result, the control unit 60 outputs a command to change the height of the probe position detecting camera 18 from the reference plane to the height adjusting mechanism 21. The control unit 60 can use various methods when comparing the height of the probe 25 calculated from the configuration data and the product type parameters, etc. with the height of the probe 25 detected by the probe height detector 20. For example, the control unit 60 may use a threshold value and determine that the heights match (equal to) if the comparison result is within the range of the threshold values, or determine that the heights do not match if the comparison result is outside the range of the threshold value.

When the height of the probe 25 calculated from the configuration data and the product type parameters, etc. is equal to the height of the probe 25 detected by the probe height detector 20, the control unit 60 determines that the input configuration data and product type parameters are correct. For example, as shown in FIGS. 3A and 3B, the control unit 60 compares the distance A from the reference plane (the upper surface of the wafer chuck 16) detected by the probe height detector 20 with the distance B that is the height of the probe 25 calculated from the configuration data and the product type parameters, etc., and determines that B is identical to (nearly equal to) A. Thereafter, the control unit 60, as shown in FIG. 3B, outputs to the height adjusting mechanism 21 a command to move the probe position detecting camera 18 upward to the working distance height instantly, and the probe position detecting camera 18 performs auto-focusing to detect the tip of the probe 25. That is, the probe position detecting camera 18 is driven to move in the Z-axis direction and to reach the working distance height, based on the height of the tip of the probe 25 detected by the probe height detector 20.

On the other hand, when the height of the probe 25 set based on the configuration data and the product type parameters, etc. is not the same as the height of the probe 25 acquired by the probe height detector 20, the control unit 60 determines that the input configuration data and product type parameters, etc. are erroneous, and displays an error message on the display unit 61 to inform the user of the error and stops the operation of the prober 10. Hence, it is possible to prevent a collision between the probe 25 and the probe position detecting camera 18 as described with FIG. 2B.

As another mode, when the control unit 60 determines that the input configuration data and product type parameters, etc. are erroneous, the probe position detecting camera 18 may be moved upward (lifted) to the working distance height base on the height of the probe 25 acquired by the probe height detector 20, instead of the input values. Thus, even if the input configuration data and product type parameters are erroneous, it is possible to continue measuring without stopping the prober 10.

Figure 5:
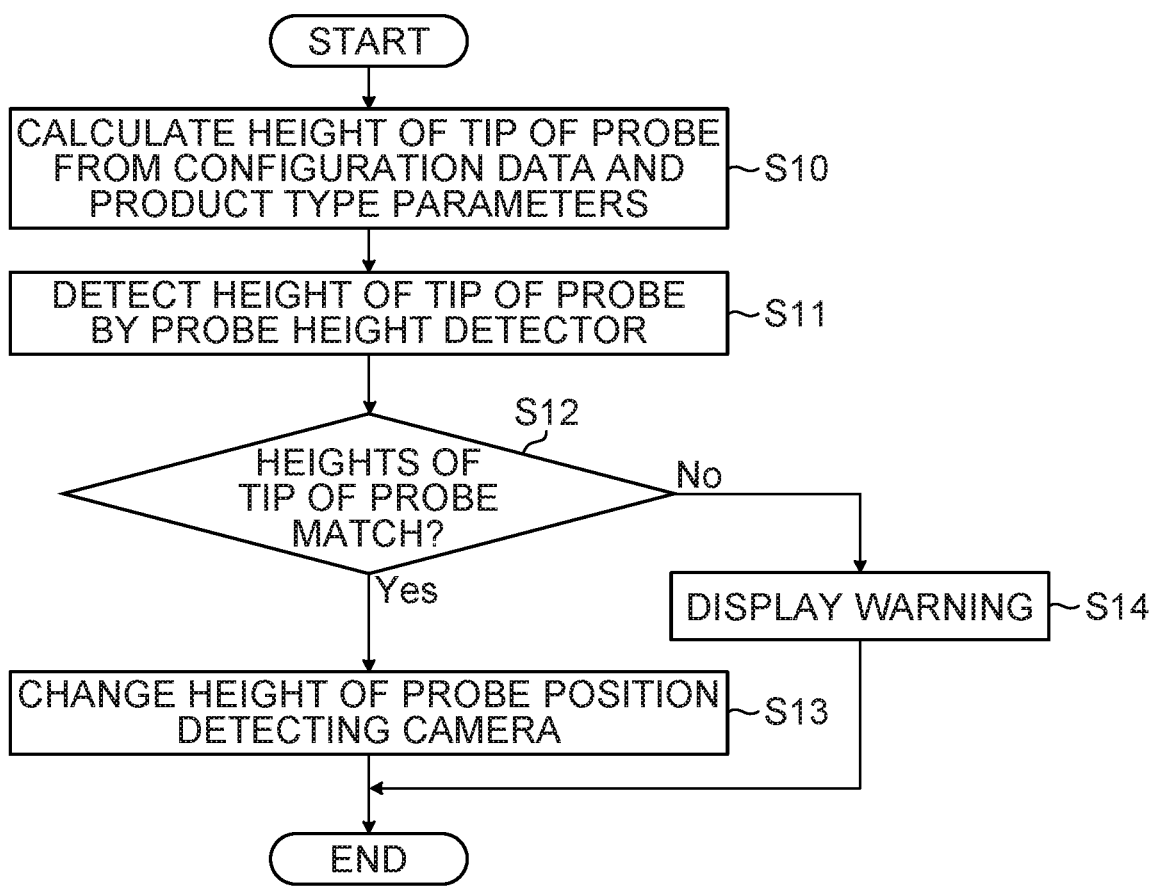
FIG. 5 is a flowchart showing a prober operation method.

FIG. 5 is a flowchart showing an operation method of the prober 10. In the operation method shown in FIG. 5, the height of the tip of the probe calculated from the configuration data and the product type parameters is judged based on the height of the probe 25 detected by the probe height detector 20.

First, the user inputs the configuration data and the product type parameters to the control unit 60 through the input unit 62. Thereafter, the control unit 60 calculates the height of the tip of the probe 25 based on the input configuration data and product type parameters (step S10). Next, the height of the probe 25 is detected by the probe height detector 20 (step S11). More specifically, the probe height detector 20 is moved upward (lifted) by the height adjusting mechanism 27, comes into contact with the probe 25, and detects the height of the probe 25.

Then, the control unit 60 compares the height of the tip of the probe 25 calculated based on the configuration data and the product type parameters with the height of the tip of the probe 25 actually detected by the probe height detector 20 (step S12). If the heights do not match (No, in step S12), the control unit 60 causes the display unit 61 to display a warning indicating an error (step S14).

On the other hand, if the heights match (Yes, in step S12), the control unit 60 outputs to the height adjusting mechanism 21 a command to lift the probe position detecting camera 18 to the working distance height. Thereafter, the probe position detecting camera 18 is moved upward to the working distance height according to the command (step S13).

Figure 6:
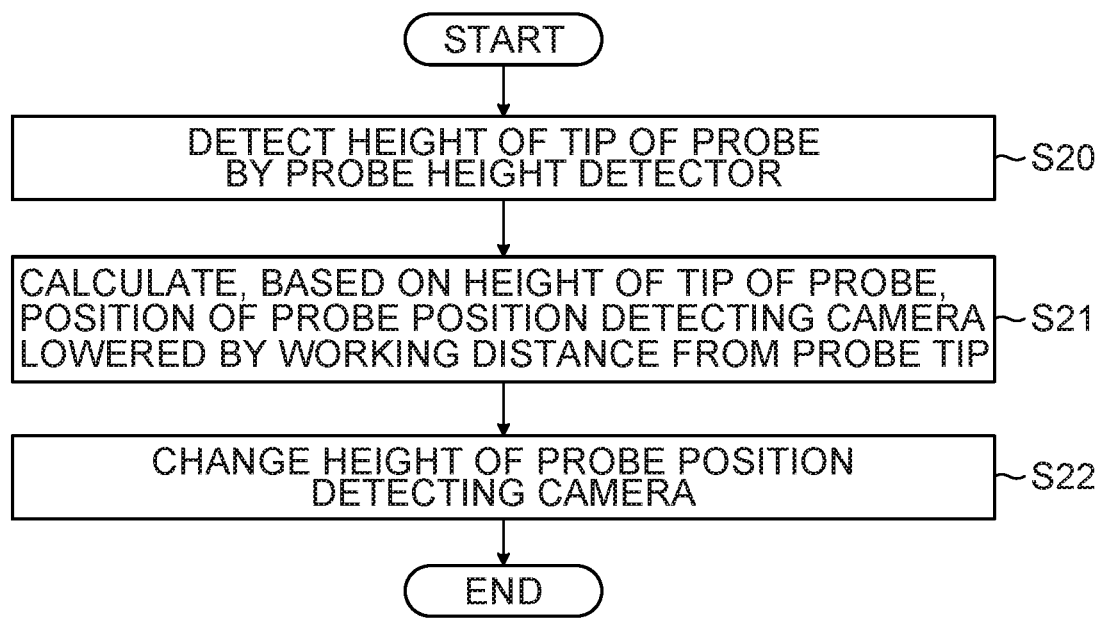
FIG. 6 is a flowchart showing another prober operation method.

FIG. 6 is a flowchart showing another operation method of the prober 10. In the another operation method shown in FIG. 6, the probe position detecting camera 18 is moved upward based on the probe height detected by the probe height detector 20, without calculating the height of the tip of the probe 25 based on the configuration data and the product type parameters.

First, the height of the probe 25 is detected by the probe height detector 20 (step S20). More specifically, the probe height detector 20 is lifted by the height adjusting mechanism 27, comes into contact with the probe 25, and then the height of the tip of the probe 25 is detected. Based on the detected height of the tip of the probe 25, the control unit 60 calculates a height of the probe position detecting camera 18 separated from the tip of the probe 25 by the working distance (the working distance height), and outputs a command to the height adjusting mechanism 21 (step S21).

Thereafter, based on the height of the tip of the probe 25 detected by the probe height detector 20, the height of the probe position detecting camera 18 is changed to the working distance height (step S22). As shown in FIG. 6, the height of the tip of the probe 25 detected by the probe height detector 20 may be used, without inputting the configuration data and the product type parameters and calculating the height of the tip of the probe 25.

The each of the above-described configurations and functions can be appropriately realized by arbitrary hardware, software, or a combination of hardware and software. For example, the present invention is also applicable to a program that causes a computer to execute the above-described processing steps (processing procedure), a computer-readable recording medium (non-transitory recording medium) in which such a program is recorded, or a computer capable of installing such a program.

Second Embodiment

Next, a second embodiment will be described.

Figure 7:
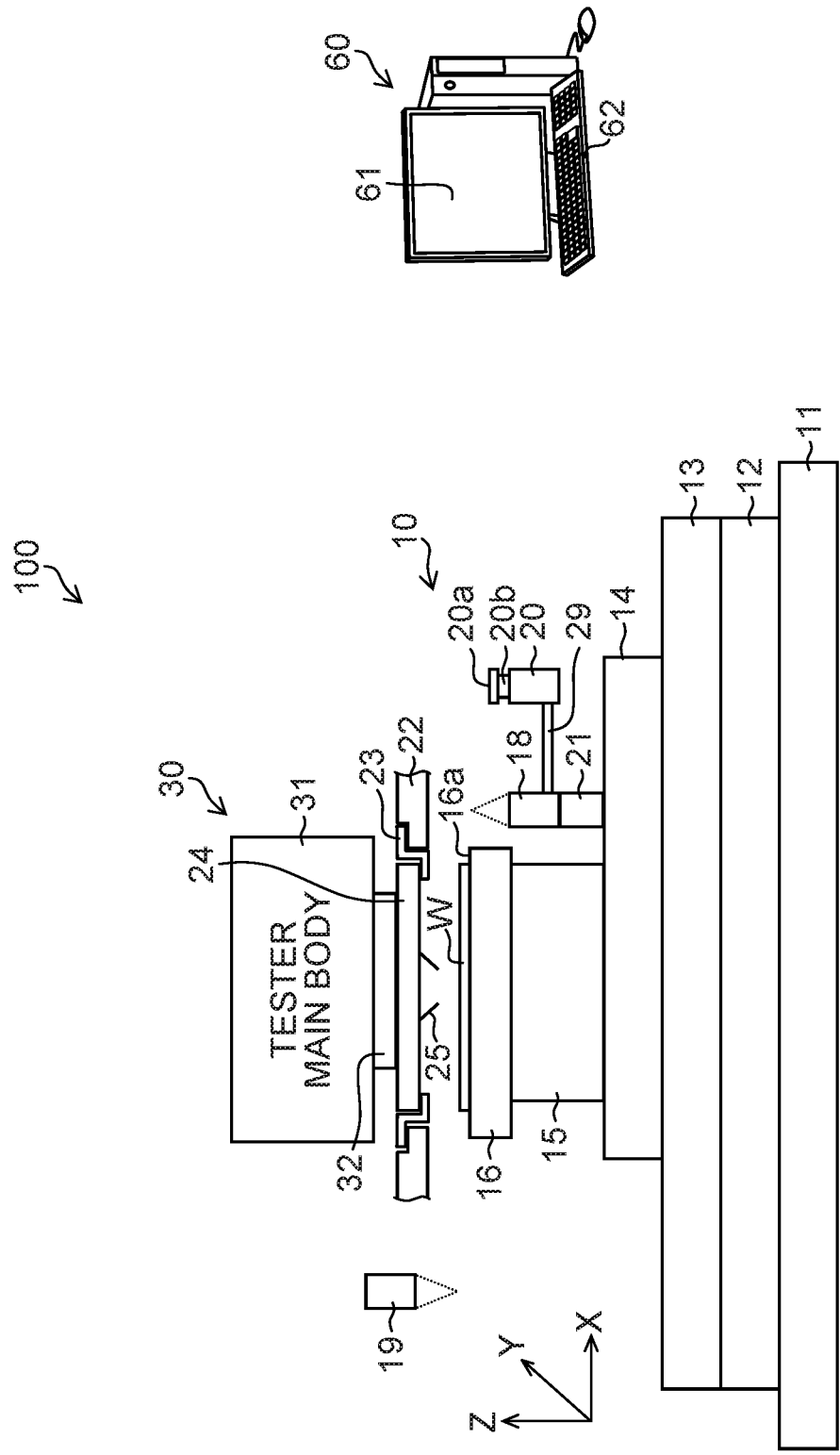
FIG. 7 is a schematic configuration diagram illustrating a wafer test system according to a second embodiment.

FIG. 7 is a schematic configuration diagram illustrating the second embodiment of the wafer test system 100 to which the present invention is applied. Here, the parts already described with FIG. 1 will be labelled with the same reference numerals, and description will be omitted.

The prober 10 shown in FIG. 7 is different from the prober 10 shown in FIG. 1 in that the probe height detector 20 is provided integrally with the probe position detecting camera 18.

The probe height detector 20 is provided integrally with the probe position detecting camera 18, and the height of the probe position detecting camera 18 is adjusted by the height adjusting mechanism 21. That is, since the probe height detector 20 and the probe position detecting camera 18 are provided integrally through an arm 29, it is possible to adjust the heights with a single height adjusting mechanism, thereby further simplifying control of the height adjustment. Moreover, since one height adjusting mechanism can be omitted, the design and assembling of the prober 10 are simplified. In addition, since the probe height detector 20 is provided integrally with the probe position detecting camera 18, the influence of temperature on the probe height detector 20 is suppressed. That is, since the change in temperature is generally small in the probe position detecting camera 18, if the probe height detector 20 is provided integrally with the probe position detecting camera 18, the influence of temperature change on the probe height detector 20 is suppressed. On the other hand, for example, in the case when the probe position detecting camera 18 is mounted on the wafer chuck 16, since the temperature change of the wafer chuck 16 is between −60° C. and 200° C., the probe height detector 20 is susceptible to the influence of temperature change.

Here, the probe height detector 20 is provided integrally with the probe position detecting camera 18 by a known technique. In FIG. 7, the probe height detector 20 is attached to a side of the probe position detecting camera 18 with the arm 29, but the probe height detector 20 may be mounted by other means.

Figure 8A:
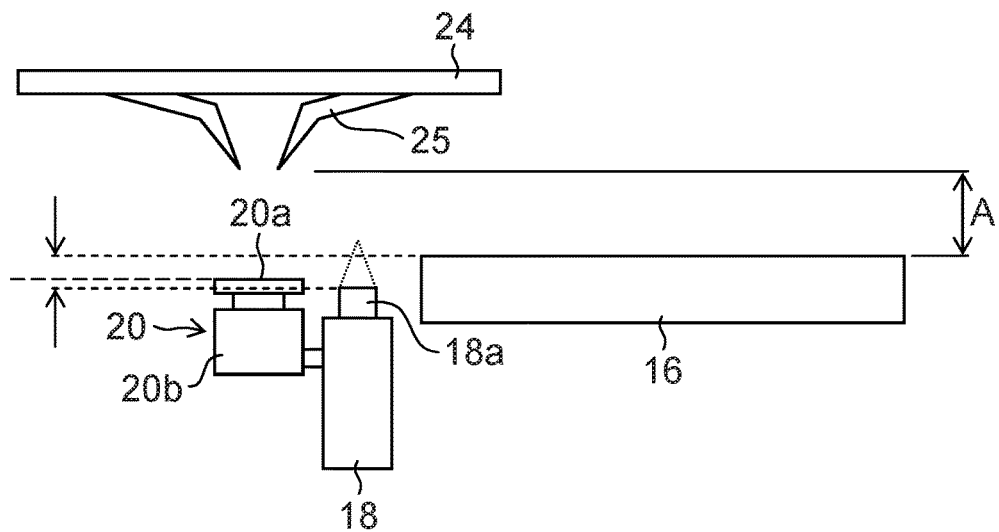
FIG. 8A is an explanatory view regarding detection of the height of the tip of the probe.
Figure 8B:
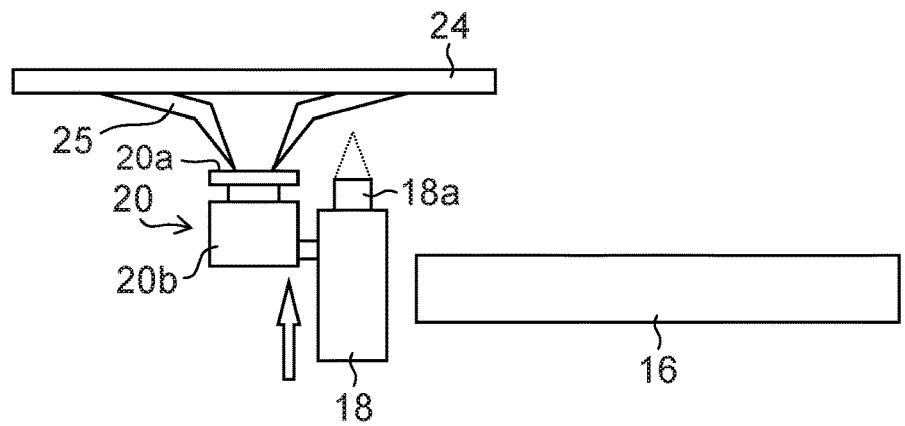
FIG. 8B is an explanatory view regarding detection of the height of the tip of the probe.
Figure 8C:
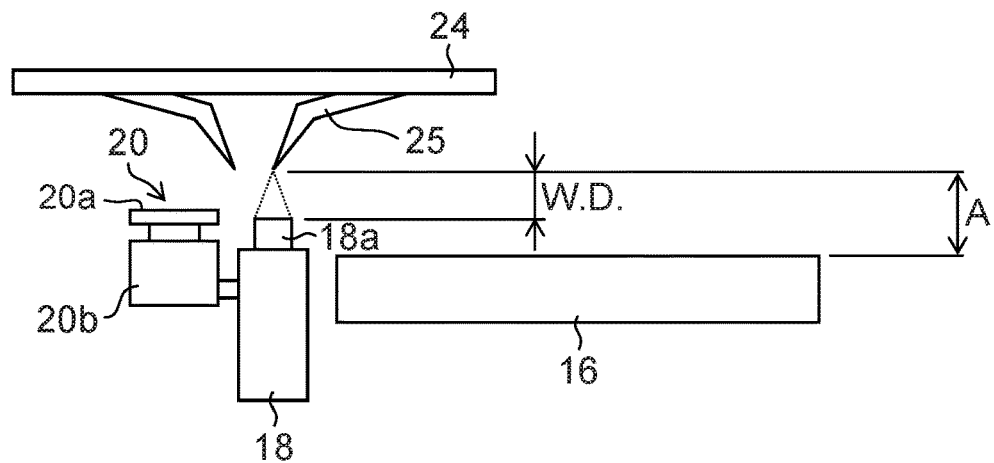
FIG. 8C is an explanatory view regarding detection of the height of the tip of the probe.

FIGS. 8A to 8C are explanatory diagrams regarding detection of the tip of the probe 25 performed when the probe height detector 20 and the probe position detecting camera 18 are integrally provided.

As shown in FIG. 8A, when the probe height detector 20 is provided integrally with the probe position detecting camera 18, the height of the contact surface 20a of the probe height detector 20 is preferably set at a position higher than the height of an end portion of the objective lens 18a of the probe position detecting camera 18. Accordingly, before the probe 25 collides with the objective lens 18a of the probe position detecting camera 18, the tip of the probe 25 can be detected by the contact surface 20a of the probe height detector 20. The contact surface 20a of the probe height detector 20 is set at a position lower than a height calculated by adding the working distance to the height of the probe position detecting camera 18. By this arrangement, the contact surface 20a does not prevent the probe position detecting camera 18 from performing auto-focusing and detecting the tip of the probe 25.

FIG. 8B is a diagram illustrating the measurement of the height of the tip of the probe 25 by the probe height detector 20. The probe height detector 20 is provided integrally with the probe position detecting camera 18, and is driven to move up and down by the height adjusting mechanism 21 of the probe position detecting camera 18 to measure the height of the tip of the probe 25.

FIG. 8C is a diagram illustrating the probe position detecting camera 18 moved to the working distance height. The probe position detecting camera 18 is moved to the working distance height by the height adjusting mechanism 21 based on the height of the tip of the probe 25 detected by the probe height detector 20. Here, the height relationship between the probe position detecting camera 18 and the probe height detector 20 is unchangeable (constant) because the probe position detecting camera 18 and the probe height detector 20 are integrally provided. Therefore the control unit 60 can easily control the height of the probe position detecting camera 18 according to the height of the tip of the probe 25 detected by the probe height detector 20. Moreover, since the probe position detecting camera 18 and the probe height detector 20 are integrally provided, the distance between the contact surface 20a of the probe height detector 20 and the objective lens 18a of the probe position detecting camera 18 is extremely short in the Z-axis direction, the X-axis direction and the Y-axis direction (see FIG. 7). Thus, it is possible to shorten the moving time for focusing the probe position detecting camera 18 onto the tip of the probe 25 after detecting the tip of the probe 25 by the contact surface 20a of the probe height detector 20.

<Application Example of Detection of Height of Tip of Probe>

Next, a mode of application of the above-described detection of the height of the tip of the probe 25 will be described.

The detection of the height of the tip of the probe 25 is applicable to various modes. In particular, the detection of the height of the tip of the probe 25 can be suitably applied to a mode that requires an accurate height of the tip of the probe 25. For example, the above-described detection of the height of the tip of the probe 25 is applicable to detection of an inclination of the probe card 24 of the probe 25.

Figure 9:
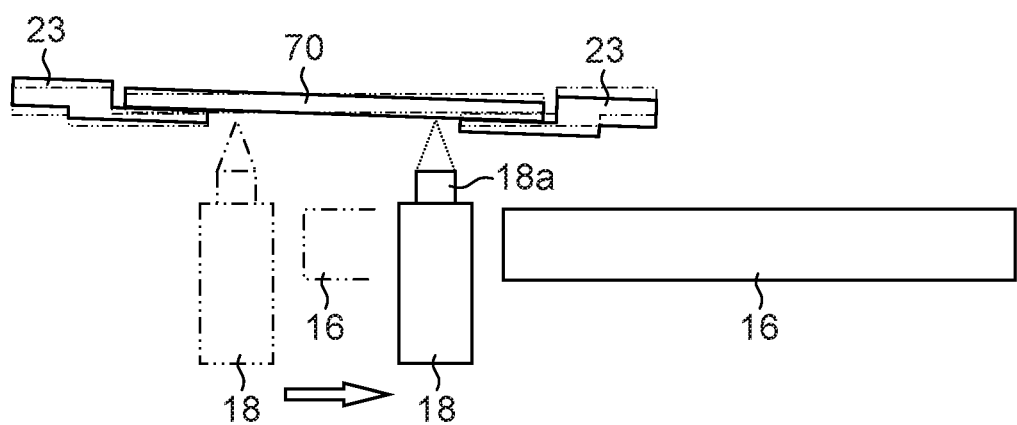
FIG. 9 is an explanatory view regarding detection of an inclination of a card holder or a probe card.

FIG. 9 is an explanatory diagram regarding a method of detecting the inclination of the card holder 23 or the probe card 24 placed in the card holder 23, which is performed conventionally in general. In the case of FIG. 9, a parallelism checking jig 70 is set on the card holder 23 in place of the probe card 24, and the inclination of the card holder 23 is detected. More specifically, the inclination of the card holder 23 is detected by detecting the height of the surface of the parallelism checking jig 70 set on the card holder 23 a plurality of times by the probe position detecting camera 18.

If an attempt is made to detect the tip of the probe 25 of the probe card 24 by the probe position detecting camera 18, it takes time to detect the probe tip, and the throughput of the prober 10 is degraded. Whereas, when the parallelism checking jig 70 is used in place of the probe card 24, even the probe position detecting camera 18 can focus in a relatively short time because the surface of the parallelism checking jig 70 is flat. Here, for example, the parallelism checking jig 70 is a metal plate processed to resemble the probe card 24.

However, when the inclination of the card holder 23 is detected with the use of the parallelism checking jig 70, the processing precision of the parallelism checking jig 70 affects the accuracy of inclination detection. Moreover, after the inclination detection with the parallelism checking jig 70 is finished, the probe card 24 must be set in the card holder 23, resulting in a degradation in the throughput.

Therefore, in the present example, the inclination of the card holder 23 used for the probe card 24 (or the probe card 24) is detected by applying the above-described detection of the height of the tip of the probe 25 using the probe height detector 20.

Figure 10:
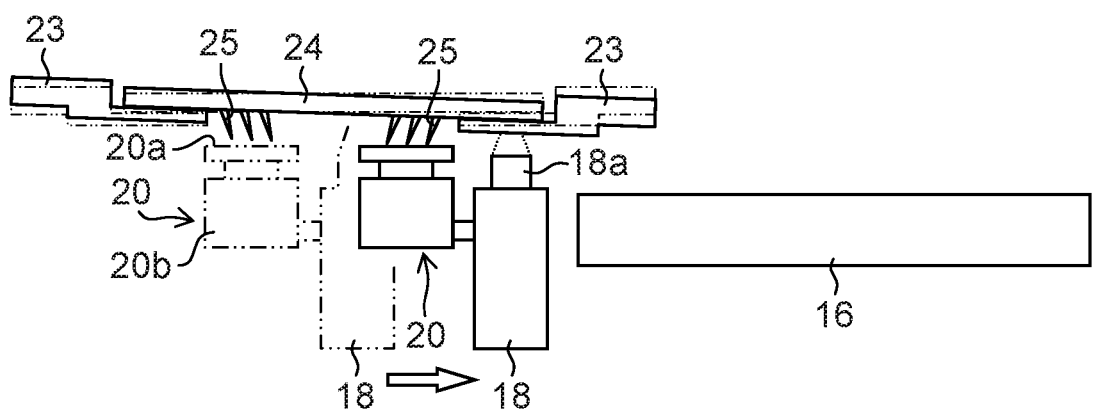
FIG. 10 is a diagram illustrating that the inclination of the probe card is detected by the probe height detector.
Figure 11:
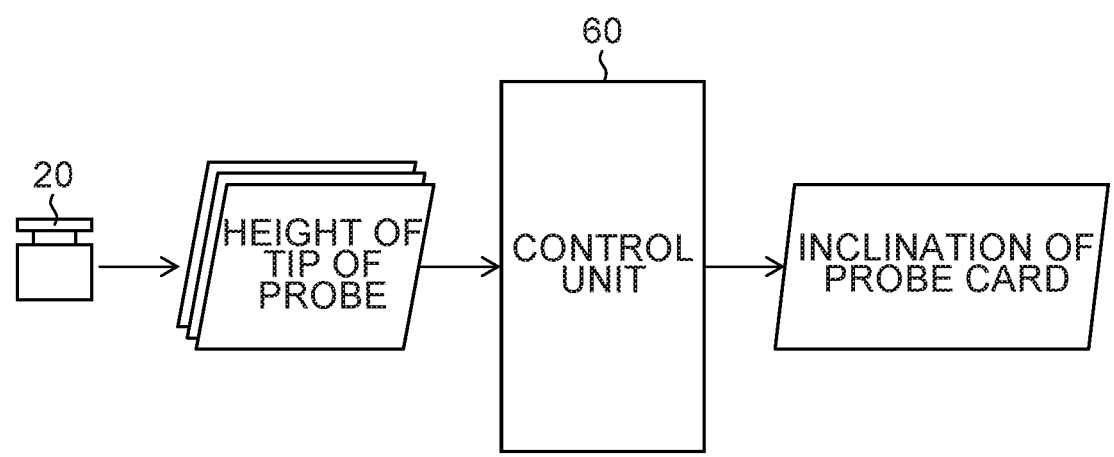
FIG. 11 is a diagram conceptually illustrating information input to the control unit and information output from the control unit, together with function blocks.

FIG. 10 and FIG. 11 are explanatory diagrams regarding detection of the inclination of the card holder 23 or the probe card 24 of the present example. In FIG. 10, the inclination of the probe card 24 set on the card holder 23 is detected by the probe height detector 20.

The probe height detector 20 is provided integrally with the probe position detecting camera 18, driven to move up and down by the height adjusting mechanism 21 of the probe position detecting camera 18, and comes into contact with the tip of the probe 25 to detect the height of the tip of the probe 25.

FIG. 11 is a diagram conceptually illustrating information input to the control unit 60 and information output from the control unit 60 with function blocks.

As shown in FIG. 11, a plurality of pieces of information about the height of the tip of the probe 25 obtained by actual measurements from the probe height detector 20 are input to the control unit 60. Here, the reason why a plurality of heights of the tip of the probe 25 are input is to calculate the inclination of the probe card 24, or the inclination of the card holder 23. Therefore, for example, the probe height detector 20 transmits the heights of the tip of the probe 25 at three different points to the control unit, and the control unit 60 outputs the inclination of the probe card 24. Note that, in the present patent application, an inclination adjusting mechanism that adjusts the inclination based on the detected inclination is not particularly described, but the inclination may be adjusted based on the inclination detected by a known inclination adjusting mechanism.

Next, according to the above-described application example, an example in which the inclination of the probe card 24 is further detected by the probe position detecting camera 18 will be described.

Figure 12:
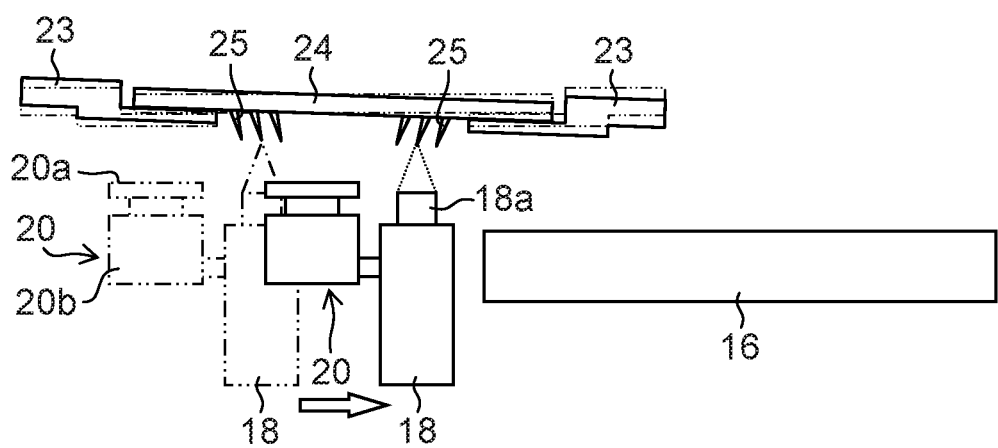
FIG. 12 is a diagram illustrating that the inclination of the probe card is detected by the probe position detecting camera.

In FIG. 12, the inclination of the probe card 24 is detected by the probe position detecting camera 18. In this case, the probe position detecting camera 18 detects the height of the tip of the probe 25 based on the height of the tip of the probe 25 detected by the probe height detector 20. That is, as described with FIGS. 3A to 3B and FIGS. 8A to 8C, the probe position detecting camera 18 is moved to the working distance height by the height adjusting mechanism 21 based on the height of the tip of the probe 25 detected by the probe height detector 20, and then detects the height of the tip of the probe 25. Similarly to the above-described probe height detector 20, the probe position detecting camera 18 detects the height of the tip of the probe 25 at a plurality of different points, and the control unit 60 detects the inclination of the probe card 24, based on the detected heights of the tip of the probe 25.

Thus, in the present example, the inclination of the probe card 24 is detected based on the heights of the tip of the probe 25 output from the probe height detector 20 and the probe position detecting camera 18.

Figure 13:
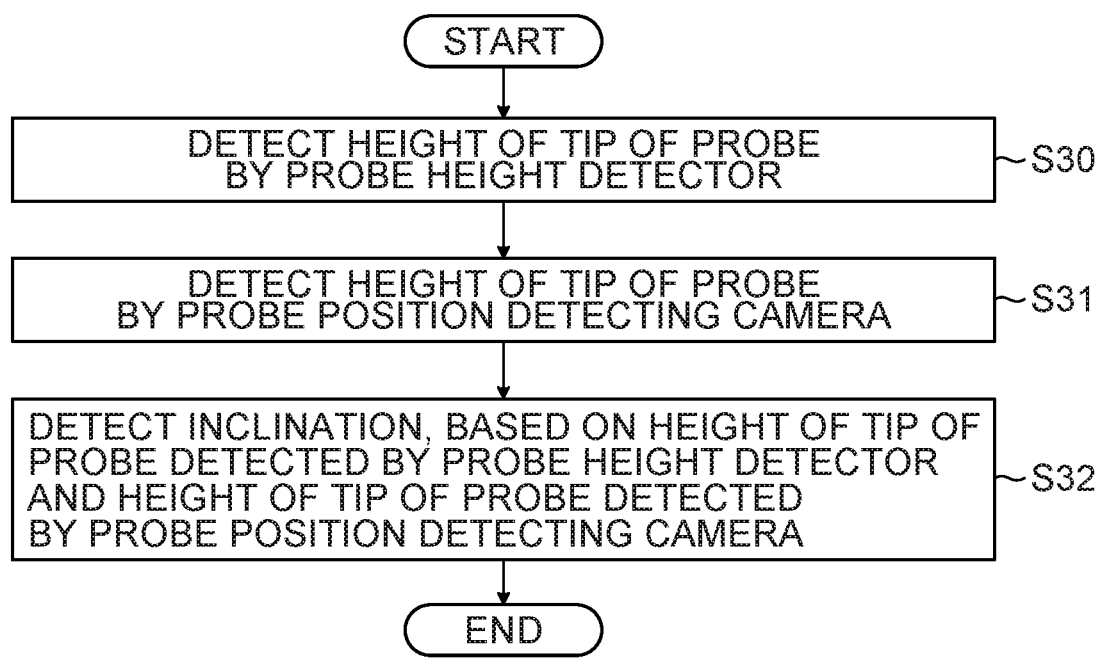
FIG. 13 is a flowchart showing a procedure for detecting the inclination.

FIG. 13 is a flowchart showing the procedure of detecting the inclination of the probe card 24 (card holder 23) according to the present example. FIG. 13 shows an example in which the heights of the tip of the probe 25 are detected by the probe height detector 20 and the probe position detecting camera 18, and the inclination is detected.

First, the height of the tip of the probe 25 is measured a plurality of times by the probe height detector 20, and the measurement results are transmitted to the control unit 60 (first height detection step: step S30). The plurality of times of measurement are made at different points, and the probe height detector 20 moves in the X-axis direction and the Y-axis direction and measures the height of the tip of the probe 25.

Next, the height of the tip of the probes 25 is measured a plurality of times by the probe position detecting camera 18, and the measurement results are transmitted to the control unit 60 (second height detection step: step S31). Like the probe height detector 20, the probe position detecting camera 18 detects the height of the tip of the probe 25 at a plurality of different points. Here, the probe position detecting camera 18 is moved to the working distance height based on the heights of the tip of the probe 25 detected in advance by the probe height detector 20, and performs auto-focusing on the tip of the probe 25. Consequently, since the time taken to search for the tip of the probe 25 by the probe position detecting camera 18 can be decreased, it is possible to suppress the degradation in the throughput of the prober 10.

Thereafter, the control unit 60 calculates the inclination of the probe card 24 based on a plurality of heights of the tip of the probe 25 output from the probe height detector 20 and the probe position detecting camera 18 (inclination detection step: step S32). Here, the control unit 60 detects the inclination based on the heights of the tip of the probe 25 detected by the probe height detector 20, and then detects the inclination based on the heights of the tip of the probe 25 detected by the probe position detecting camera 18. Since the control unit 60 performs the inclination detection using the detection results of the probe position detecting camera 18 capable of detecting the height of the tip of the probe 25 with higher accuracy, it is possible to perform more accurate inclination detection.

<Probe Height Detector of Another Embodiment>

Figure 14:
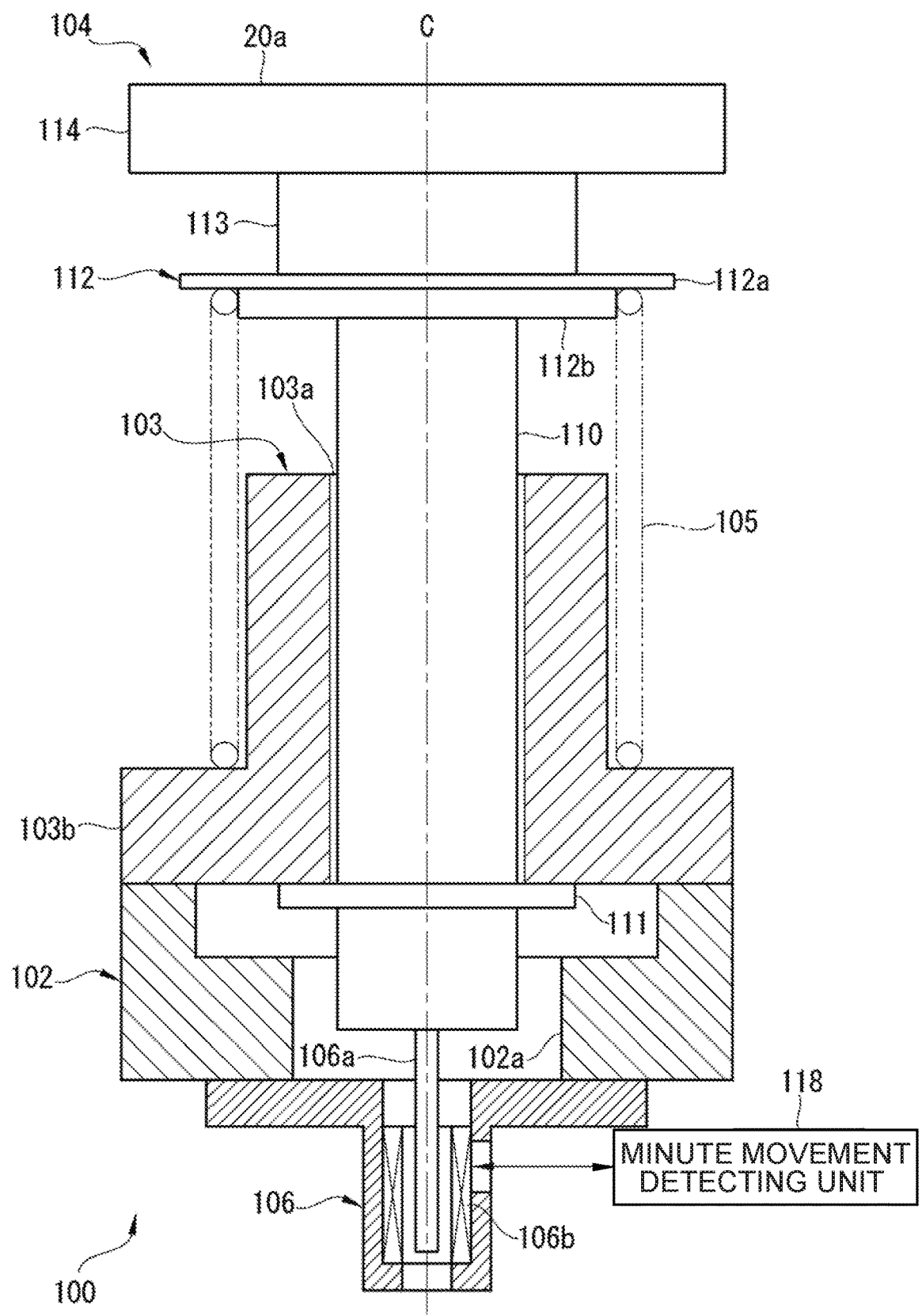
FIG. 14 is an explanatory view for explaining a probe height detector according to another embodiment.

FIG. 14 is an explanatory diagram for explaining a probe height detector 100 according to another embodiment. As shown in FIG. 14, the probe height detector 100 of another embodiment uses an LVDT 106 which is a linear variable differential transformer to measure the height of the tip of the probe 25 from the above-mentioned reference plane. The probe height detector 100 includes a base 102, an air bearing 103, a vertically moving part 104, a coil spring 105, and the LVDT 106.

The base 102 is supported above the height adjusting mechanism 27 by a support member, not shown. The base 102 is formed in a substantially annular shape, and a through-hole 102a parallel to the Z-axis direction (vertical direction) is formed at the center of the base 102. The air bearing 103 is provided on the upper surface of the base 102.

The air bearing 103 is formed in a substantially cylindrical shape and has a holding hole 103a parallel to the Z-axis direction. The position of the center of the holding hole 103a in the XY-axis direction coincides with the position of the center of the above-mentioned through-hole 102a in the XY-axis direction. Reference character C denotes a center axis passing through the center of both the holding hole 103a and the through-hole 102a. The air bearing 103 holds a vertically moving shaft 110 inserted through the holding hole 103a and provided in a later-described vertically moving part 104, so that the vertically moving shaft 110 is movable in the Z-axis direction.

The air bearing 103 is formed with an air supply hole, not shown, penetrating to the inner surface of the holding hole 103a from the outer circumferential surface of the air bearing 103 The air supplied from an air source, not shown, through the air supply hole is supplied into the holding hole 103a. Consequently, an air layer, not shown, is formed between the inner surface of the holding hole 103a and the outer surface of the vertically moving shaft 110, and hence the vertically moving shaft 110 is guided in a non-contact manner by the air bearing 103 (holding hole 103a).

Moreover, an annular flange portion 103b is formed on the outer circumferential surface of the lower end portion of the air bearing 103 along the circumferential direction.

The vertically moving part 104 is held by the air bearing 103 so that the vertically moving part 104 is movable in the Z-axis direction in a non-contact manner. The vertically moving part 104 includes the vertically moving shaft 110, a stopper ring 111, a spring receiving portion 112, a stage pedestal 113, and a stage 114.

As described above, the vertically moving shaft 110 is inserted into the holding hole 103a of the air bearing 103 and held by the air bearing 103 so that the vertically moving shaft 110 is movable in the Z-axis direction in a non-contact manner. The stopper ring 111 in a substantially annular shape is externally fitted on the lower end portion of the outer circumferential surface of the vertically moving shaft 110. The spring receiving portion 112 is fixed to the upper surface of the vertically moving shaft 110.

The outer diameter of the stopper ring 111 is formed larger than the diameter of the holding hole 103a. The spring receiving portion 112 includes a disk portion 112a and a fitting portion 112b attached to the lower surface of the disk portion 112a. The outer diameter of the disk portion 112a is formed larger than the outer diameter of the coil spring 105. The fitting portion 112b is fitted into the opening portion on the upper side of the coil spring 105.

The stage pedestal 113 is fixed to the upper surface of the spring receiving portion 112. The stage 114 is fixed to the upper surface of the stage pedestal 113. The upper surface of the stage 114 serves as the above-described contact surface 20a.

The coil spring 105 is installed between the flange portion 103b and the spring receiving portion 112 in a compressed manner in the Z-axis direction. The upper end portion of the above-described air bearing 103 is inserted into the opening portion on the lower side of the coil spring 105. Thus, the lower end of the coil spring 105 comes into contact with the upper surface of the flange portion 103b. On the other hand, the above-mentioned fitting portion 112b is fitted into the opening portion on the upper side of the coil spring 105. Consequently, the coil spring 105 urges the respective portions (the stage 114, etc.) of the vertically moving part 104 upward in the Z-axis direction through the spring receiving portion 112. As a result, the stopper ring 111 comes into contact with the opening edge portion on the lower side of the holding hole 103a, and the position of the height of the stage 114 in the Z-axis direction is maintained constant.

The LVDT 106 is attached to the lower surface of the base 102. The LVDT 106 includes a core 106a such as an iron core, and a coil 106b. The core 106a is fixed to the lower surface of the vertically moving shaft 110 and extends downward in the Z-axis direction. The center axis of the core 106a coincides with the above-mentioned center axis C. The core 106a moves integrally with the vertically moving shaft 110 (the vertically moving part 104) in the Z-axis direction.

The coil 106b has a substantially cylindrical shape parallel to the Z-axis direction. The core 106a is inserted in a non-contact manner into the coil 106b. The coil 106b has a primary coil (not shown) excited by an input voltage (AC), and a secondary coil (not shown) in which an output voltage (induced voltage) is generated by a displacement of the core 106a in the Z-axis direction.

A minute movement detecting unit 118 supplies an input voltage to the coil 106b and detects an output voltage output from the coil 106b according to the displacement of the core 106a in the Z-axis direction. Based on the output voltage output from the coil 106b, the minute movement detecting unit 118 detects a minute movement in the Z-axis direction of the core 106a, that is, the vertically moving part 104 (the stage 114, etc.).

According to the probe height detector 100 having the above configuration, when the height adjusting mechanism 27 moves the probe height detector 100 upward in the Z-axis direction and brings the contact surface 20a of the stage 114 in contact with the tip of the probe 25, the vertically moving part 104 (the stage 114, etc.) and the core 106a are minutely moved downward in the Z-axis direction. Consequently, the output voltage output from the coil 106b according to the minute movement of the core 106a is input to the minute movement detecting unit 118. Hence, the minute movement detecting unit 118 can detect the minute movement in the Z-axis direction of the vertically moving part 104 (the stage 114, etc.), that is, the contact of the tip of the probe 25 with the contact surface 20a. The subsequent procedure is the same as the above-described procedure with the probe height detector 20, and therefore detailed description will be omitted.

Thus, since the probe height detector 100 detects the contact of the tip of the probe 25 with the contact surface 20a by using the LVDT 106, it is possible to improve the contact detection accuracy [contact responsiveness (sensitivity)]. As a result, the accuracy of measuring the height of the tip of the probe 25 from the above-mentioned reference plane can be improved. Furthermore, it is possible to accurately detect the movement amount (pushed amount) of the stage 114, etc. in the Z-axis direction caused by the contact of the tip of the probe 25 with the contact surface 20a, and the pressing force in the Z-axis direction caused by the contact.

The examples of the present invention have been described, but the present invention is not limited to the above-described embodiments, and, needless to say, various modifications can be made without departing from the spirit of the present invention.

REFERENCE SIGNS LIST

10 . . . Prober
11 . . . Base
12 . . . Moving base
13 . . . Y-axis moving table
14 . . . X-axis moving table
15 . . . Rotating part
16 . . . Wafer chuck
18 . . . Probe position detecting camera
18a . . . Objective lens
19 . . . Wafer Alignment Camera
20, 100 . . . Probe height detector
20a . . . Contact surface
20b . . . Sensor mechanism
21 . . . Height adjusting mechanism
22 . . . Head stage
23 . . . Card holder
24 . . . Probe card
25 . . . Probe
27 . . . Height adjusting mechanism
29 . . . Arm
30 . . . Tester
31 . . . Tester main body
32 . . . Contact ring
60 . . . Control unit
61 . . . Display unit
62 . . . Input unit
100 . . . Wafer test system
106 . . . Linear variable differential transformer (LVDT)

What is claimed is:
1. A prober for performing an inspection by bringing a probe into contact with an electrode of a wafer arranged to face the probe, the prober comprising:
a probe position detecting camera configured to detect positions of a tip of the probe including a position in a direction on a horizontal plane and a height position in a direction perpendicular to the horizontal plane, at a position facing the probe; and a probe height detector provided integrally with the probe position detecting camera and configured to detect a height position of the tip of the probe, at a position facing the probe, wherein the probe height detector is a contact-type detector including a contact surface that comes into contact with the tip of the probe and configured to detect a height position of the contact surface when the tip of the probe makes contact with the contact surface as the height position of the tip of the probe, and the height position of the contact surface is set at a position higher than a height position of the probe position detecting camera.

2. The prober according to claim 1, further comprising a height adjusting mechanism configured to change the height of the probe position detecting camera from a reference plane serving as a reference for a height of the probe position detecting camera, based on a detection result by the probe height detector.

3. The prober according to claim 1,
wherein the probe height detector includes a variable differential transformer configured to detect contact of the tip of the probe.

4. A prober operation method for performing an inspection by bringing a probe into contact with an electrode of a wafer, the prober operation method comprising:
a first detection step of detecting positions of a tip of the probe including a position in a direction on a horizontal plane and a height position in a direction perpendicular to the horizontal plane, at a position facing the probe by a probe position detecting camera; and
a second detection step of detecting a height position of the tip of the probe, at a position facing the probe by a probe height detector provided integrally with the probe position detecting camera, wherein
the probe height detector is a contact-type detector including a contact surface that comes into contact with the tip of the probe, and configured to detect a height position of the contact surface when the tip of the probe makes contact with the contact surface as the height position of the tip of the probe, and
the height position of the contact surface is set at a position higher than a height position of the probe position detecting camera.

5. The prober operation method according to claim 4, further comprising
a height adjusting step of changing the height of the probe position detecting camera from a reference plane serving as a reference for a height of the probe position detecting camera, based on a detection result in the second detection step.

6. The prober operation method according to claim 4,
wherein the second detection step includes detecting contact of the tip of the probe using a variable differential transformer.

7. A prober operation method for performing an inspection by bringing a probe into contact with an electrode of a wafer, the prober operation method comprising:
a first height detection step of detecting a height of a tip of the probe from a reference plane serving as a reference for a height of a probe position detecting camera by using a probe height detector provided separately from the probe position detecting camera;
a height changing step of changing the height of the probe position detecting camera from the reference plane based on a detection result of the probe height detector; and
a step of detecting a position of the tip of the probe by using the probe position detecting camera to perform relative positional alignment between the electrode of the wafer and the probe, after the height of the probe position detecting camera is changed in the height changing step.

8. The prober operation method according to claim 7,
wherein the first height detection step detects the height of the tip of the probe by using the probe height detector including a contact surface that comes into contact with the tip of the probe and a linear variable differential transformer configured to detect contact of the tip of the probe with the contact surface.

9. The prober operation method according to claim 7, wherein
the probe height detector is of a contact type,
the first height detection step detects the height of the tip of the probe a plurality of times by using the contact-type probe height detector, and
the prober operation method further comprises an inclination detection step of detecting an inclination of the probe card based on results of detection performed a plurality of times in the first height detection step.

10. The prober operation method according to claim 9, further comprising
a second height detection step of detecting the height of the tip of the probe from the reference plane a plurality of times by using a probe position detecting camera provided integrally with the probe height detector,
wherein the inclination detection step detects the inclination of the probe card based on the detection results in the first height detection step and detection results in the second height detection step.

11. The prober operation method according to claim 10,
wherein the first height detection step is performed before the second height detection step.

12. The prober according to claim 1, further comprising
a height adjusting mechanism configured to move the probe position detecting camera to a working distance height based on the height of the tip of the probe detected by the probe height detector.

13. The prober operation method according to claim 4, further comprising
a step of moving the probe position detecting camera to a working distance height by a height adjusting mechanism based on the height of the tip of the probe detected by the probe height detector.

* * * * *